US007165976B2

(12) United States Patent
Takahashi et al.

(10) Patent No.: US 7,165,976 B2
(45) Date of Patent: Jan. 23, 2007

(54) INTERMEDIATE CONNECTOR ALLOWING EASY RETRY

(75) Inventors: Takeshi Takahashi, Tokyo (JP); Akira Kuwahara, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 11/115,821

(22) Filed: Apr. 27, 2005

(65) Prior Publication Data

US 2005/0245107 A1 Nov. 3, 2005

(30) Foreign Application Priority Data

Apr. 28, 2004 (JP) ............................ 2004-133385
Jul. 27, 2004 (JP) ............................ 2004-218959

(51) Int. Cl.
*H01R 12/00* (2006.01)
*H05K 1/00* (2006.01)

(52) U.S. Cl. ........................................................ 439/66

(58) Field of Classification Search .................. 439/66, 439/67
See application file for complete search history.

(56) References Cited

U.S. PATENT DOCUMENTS

| | | | | |
|---|---|---|---|---|
| 5,273,439 | A | 12/1993 | Szerlip et al. | 439/66 |
| 5,403,202 | A | 4/1995 | Roehling et al. | 439/493 |
| 5,928,001 | A | 7/1999 | Gillette et al. | 439/67 |
| 2001/0041465 | A1 | 11/2001 | Szalay et al | 439/67 |

FOREIGN PATENT DOCUMENTS

| | | |
|---|---|---|
| JP | 6076876 | 3/1994 |
| JP | 2002056907 | 2/2002 |
| JP | 2003123868 | 4/2003 |

*Primary Examiner*—Javaid H. Nasri
(74) *Attorney, Agent, or Firm*—Collard & Roe, P.C.

(57) ABSTRACT

In a connector adapted to be interposed between two connection objects to connect the connection objects to each other, use is made of a plate-like base member having first and second surfaces opposite to each other. An insulating sheet includes a first end fixed in position to the first surface, a second end fixed in position to the second surface, and a supporting portion having elasticity and extending between the first and the second ends with a space left between the supporting portion and the base member. A conductive portion is supported by the supporting portion and adapted to be contacted with the connection objects.

12 Claims, 14 Drawing Sheets

INTERMEDIATE CONNECTOR ALLOWING EASY RETRY

This application claims priority to prior Japanese patent applications JP 2004-133385 and JP 2004-218959, the disclosures of which are incorporated herein by reference.

BACKGROUND OF THE INVENTION

This invention relates to a connector adapted to be interposed between two connection objects to connect these connection objects to each other (hereinafter, the connector will be called an "intermediate connector").

A connector of the type is disclosed in Japanese Unexamined Patent Application Publication (JP-A) No. 2002-56907 as an "electric connecting member". The electric connecting member comprises a double-sided adhesive sheet, a conductive member penetrating the double-sided adhesive sheet, and a pair of metal thin films disposed on opposite surfaces of the double-sided adhesive sheet and connected to the conductive member.

In the electric connecting member, if an operation error occurs during a step of attaching the conductive member to the double-sided adhesive sheet, not only the conductive member but also the double-sided adhesive sheet are inevitably discarded. Thus, the electric connecting member is poor in retriability. Further, since the electric connecting member has a structure in which the metal thin films fixed to the opposite surfaces of the double-sided adhesive sheet are connected by the conductive member, an increased number of components are required. Therefore, the structure is complicated so that assembling and disassembling operations are troublesome, the number of production steps is increased, and the production cost is high.

Another connector of the type is disclosed in Japanese Unexamined Patent Application Publication (JP-A) No. H06-76876 as an "anisotropic conductive connector". The anisotropic conductive connector comprises an insulating film, a plurality of fine conductive patterns formed on a surface of the insulating film by etching, and a rubber-like elastic member. The insulating film is folded into a generally U shape so that the conductive patterns are exposed outside and the elastic member is interposed between folded portions of the insulating film. Further, the insulating film and the elastic member are fixed to each other.

In the anisotropic conductive connector described above, the conductive patterns can not individually be deformed or displaced. Therefore, it is difficult to accommodate deformation of the connection objects. Further, since the conductive patterns are formed by etching, a mask is required as well known in the art. Therefore, the productivity is not improved.

Still another connector of the type is disclosed in Japanese Unexamined Patent Application Publication (JP-A) No. 2003-123868 as a "press-contact connector". The press-contact connector comprises an insulating elastomer, an insulating rubber sheet covering the insulating elastomer and fixed thereto by an adhesive, and a plurality of conductive thin wires arranged along a surface of the insulating rubber sheet at a predetermined pitch.

In the press-contact connector, the insulating elastomer and the insulating rubber sheet are fixed to each other by the adhesive. Therefore, if the connector is elastically deformed, an adhered portion may be damaged due to a difference in hardness and deformability between the insulating elastomer and the insulating rubber sheet.

SUMMARY OF THE INVENTION

It is therefore an object of this invention to provide an intermediate connector allowing easy retry.

It is another object of this invention to provide an intermediate connector simple in structure with a reduced number of parts.

It is still another object of this invention to provide an intermediate connector easily adaptable to deformation of a connection object, prevented from easy separation of a constituent member, and high in productivity.

Other objects of the present invention will become clear as the description proceeds.

According to an aspect of the present invention, there is provided a connector adapted to be interposed between two connection objects to connect the connection objects to each other. The connector comprises a base member of a plate-like shape having first and second surfaces opposite to each other, an insulating sheet including a first end fixed in position to the first surface, a second end fixed in position to the second surface, and a supporting portion having elasticity and extending between the first and the second ends with a space left between the supporting portion and the base member, and a conductive portion supported by the supporting portion and adapted to be contacted with the connection objects.

DESCRIPTION OF THE PREFERRED EMBODIMENTS

At first referring to FIG. 1, description will be made of a structure of a connector according to a first embodiment of this invention.

Figure 1A:
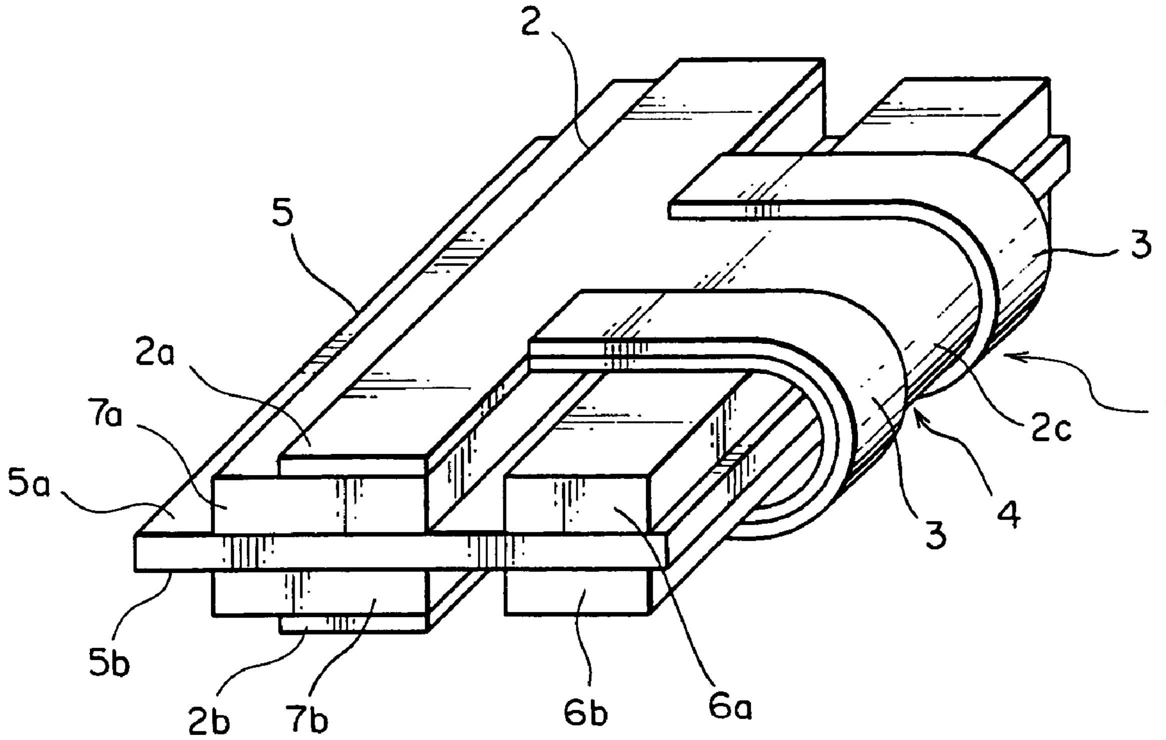
FIG. 1A is a perspective view of a connector according to a first embodiment of this invention.

The connector depicted at 1 in FIG. 1A is adapted to be interposed between two connection object boards to connect these boards to each other. The connector 1 comprises an electrode sheet 4, a plate-like base member 5 having first and second surfaces 5*a* and 5*b* opposite to each other, first and second elastic members 6*a* and 6*b*, and first and second double-sided adhesive sheets 7*a* and 7*b* fixing the electrode sheet 4 to the base member 5.

The electrode sheet 4 comprises a generally H-shaped insulating sheet 2 and two electrodes 3 fixed to the insulating sheet 2. The insulating sheet 2 has a first end 2*a* fixed to the first surface 5*a* of the base member 5 via the first double-sided adhesive sheet 7*a*, a second end 2*b* fixed to the second surface 5*b* via the second double-sided adhesive sheet 7*b*, and an elastic supporting portion 2*c* extending in a generally U shape between the first and the second ends 2*a* and 2*b* and spaced from the base member 5.

The first and the second elastic members 6*a* and 6*b* are fixed to the first and the second surfaces 5*a* and 5*b* of the base member 5 and faced to the supporting portion 2*c*. Therefore, the first and the second elastic members 6*a* and 6*b* are interposed between the supporting portion 2*c* and the first surface 5*a* and between the supporting portion 2*c* and the second surface 5*b*, respectively.

The electrodes 3 extend along an outer surface of the supporting portion 2*c* between the first and the second ends 2*a* and 2*b* with a space left from each other. The electrodes 3 are fixed to the supporting portion 2*c*. The electrodes 3 are collectively called a conductive portion.

Figure 1B:
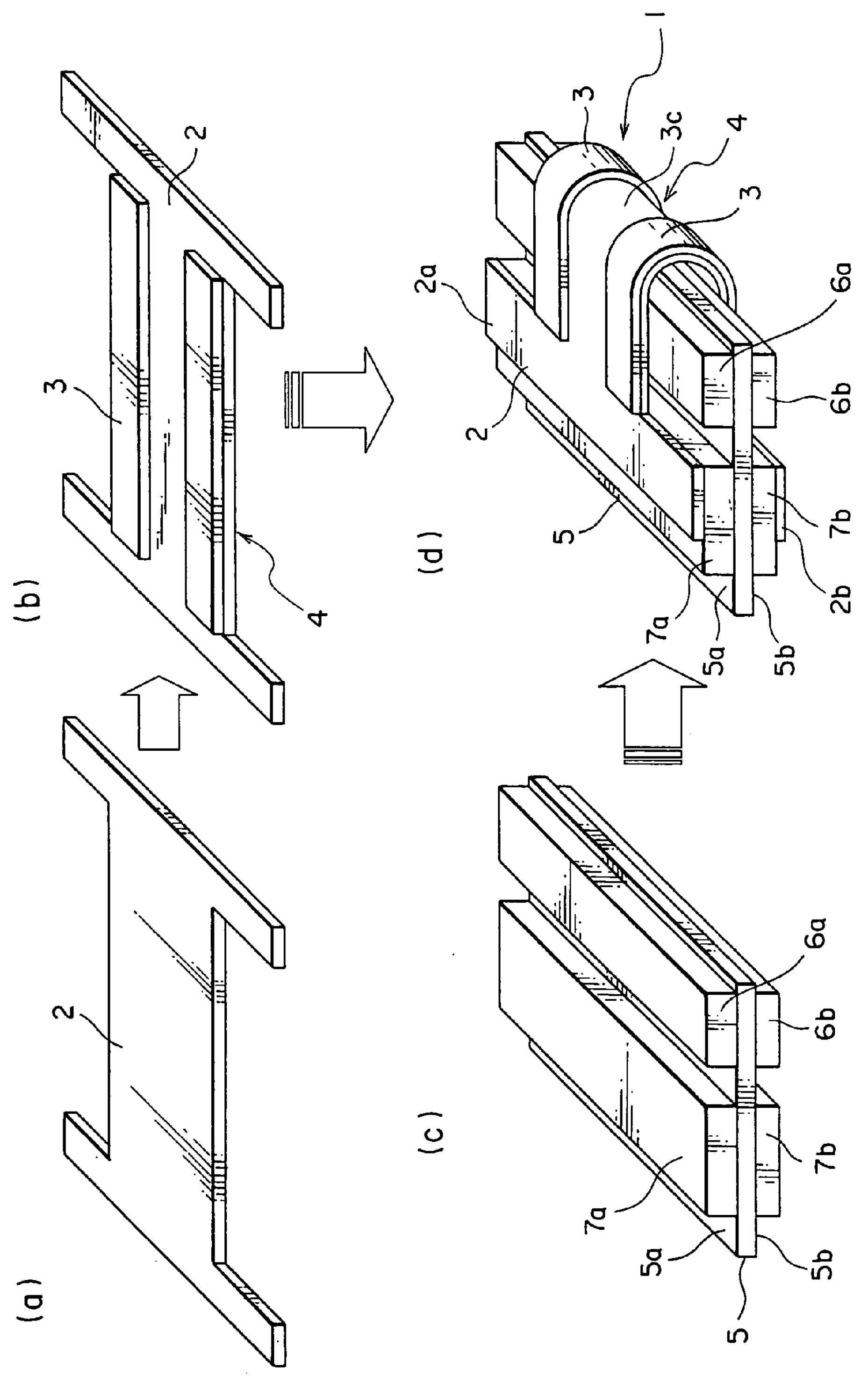
FIG. 1B is a perspective view for describing a method of producing the connector illustrated in FIG. 1A.

Next referring to FIG. 1B, description will be made of a method of producing the connector 1.

In a step (a), a generally H-shaped insulating sheet 2 is prepared. The insulating sheet 2 is preferably made of a material, such as polyimide or aramid, which is excellent in heat resistance, corrosion resistance, and insulation and which is thin and easily deformable.

In a step (b), the electrodes 3 comprising metal thin films are formed at two positions at the center of the insulating sheet 2. Desirably, the metal thin films are formed by plating, sputtering, or the like and deposited to the thickness on the order of several micrometers. The insulating sheet 2 may be provided with conductive patterns instead of the metal thin films.

In a step (c), the first and the second elastic members 6*a* and 6*b* are formed on the first and the second surfaces 5*a* and 5*b* of the base member 5. Further, the first and the second double-sided adhesive sheets 7*a* and 7*b* are adhered to the first and the second surfaces 5*a* and 5*b* of the base member 5. Desirably, the base member 5 is made of a material, such as polyimide or aramid, which is excellent in heat resistance, corrosion resistance, and insulation and which is thin and easily deformable. Desirably, the first and the second elastic members 6*a* and 6*b* are made of a material, such as a rubber-based or a gel-based material, which is excellent in deformability.

Next, in a step (d), the electrode sheet 4 is deformed into a generally U shape and attached to the base member 5 so that the electrodes 3 are positioned on the first and the second elastic members 6*a* and 6*b*. In this event, the supporting portion 2*c* winds around an end portion of the base member 5. Furthermore, the first and the second ends 2*a* and 2*b* are fixed to the first and the second surfaces 5*a* and 5*b* of the base member 5 by the first and the second double-sided adhesive sheets 7*a* and 7*b*, respectively.

Figure 2:
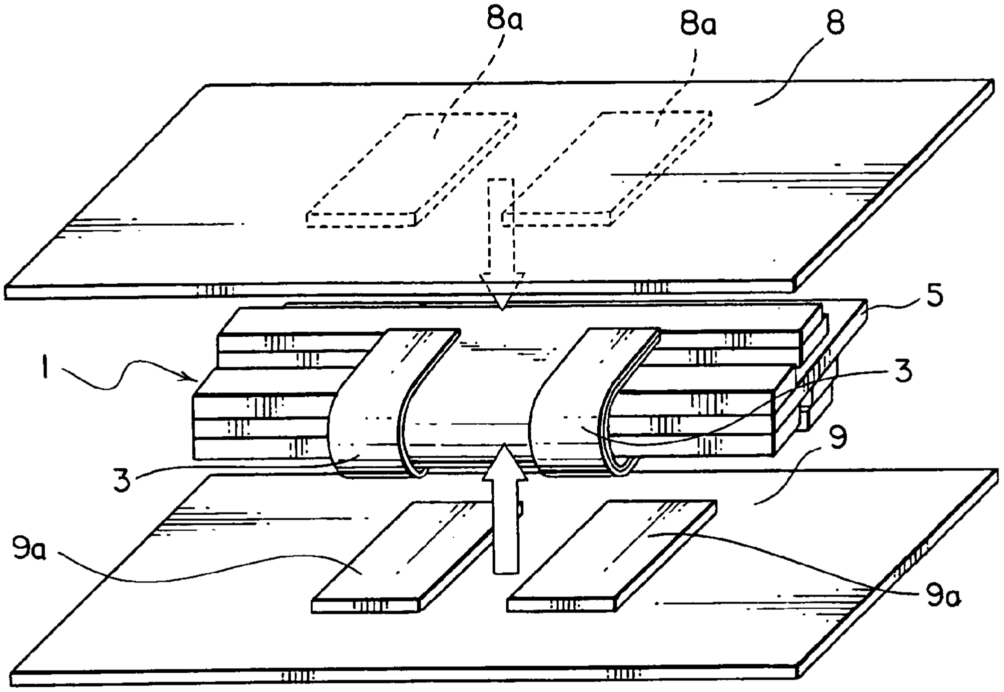
FIG. 2 is a perspective view for describing an operation of connecting two boards by the use of the connector in FIG. 1A.

Referring to FIG. 2, description will be made of an example where the connector 1 is used for connection.

The connector 1 is clamped between two connection object boards 8 and 9. At this time, a pair of electrodes 8*a* of the connection object board 8 and a pair of electrodes 9*a* of the connection object board 9 are aligned with the electrodes 3 of the connector 1. As a consequence, the electrodes 8*a* and 9*a* of the connection object boards 8 and 9 are connected to each other via the electrodes 3 of the connector 1.

Figure 3A:
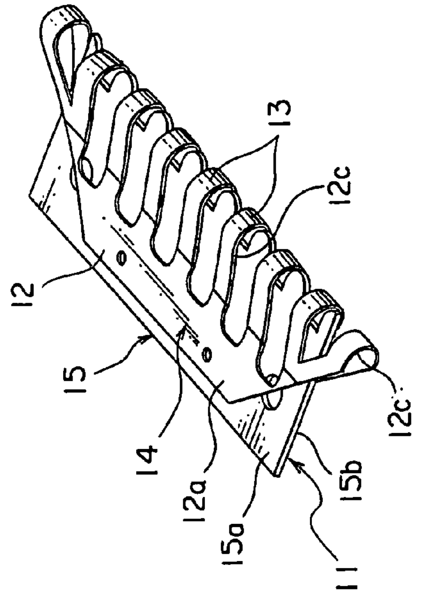
FIG. 3A is a perspective view of a connector according to a second embodiment of this invention.
Figure 3B:
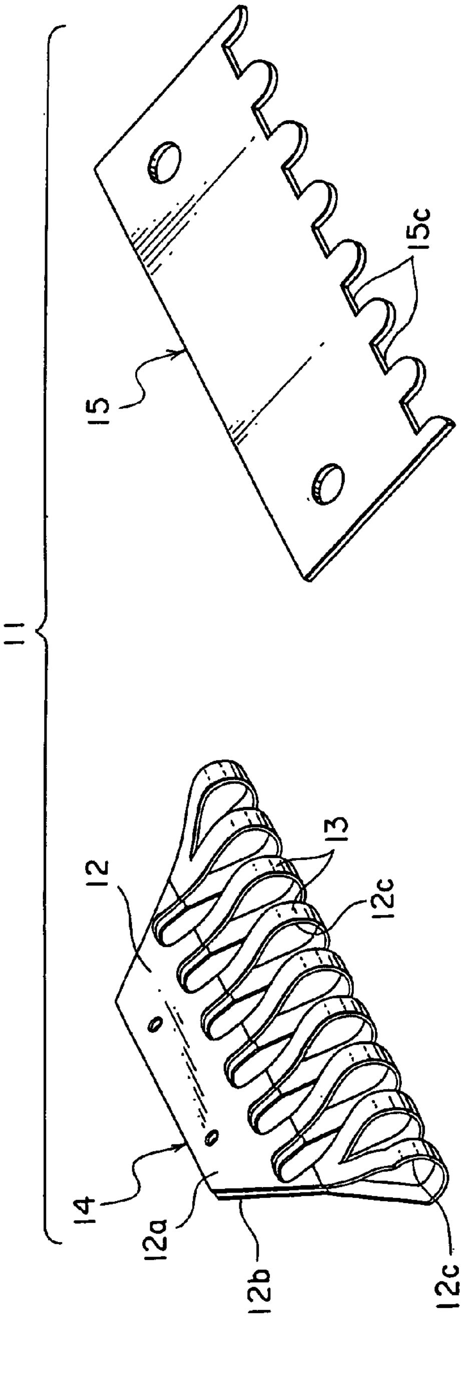
FIG. 3B is an exploded perspective view of the connector illustrated in FIG. 3A.

Referring to FIGS. 3A and 3B, description will be made of a structure of a connector according to a second embodiment of this invention.

The connector is depicted at 11 in the figures and is adapted to be interposed between two connection object boards to connect these boards to each other. The connector 11 comprises an electrode sheet 14 and a plate-like base member 15 having first and second surfaces 15*a* and 15*b* opposite to each other.

The electrode sheet 14 comprises an insulating sheet 12 and a plurality of electrodes 13 fixed to the insulating sheet 12. The insulating sheet 12 has a first end 12*a* adhered and fixed to the first surface 15*a* of the base member 15, a second end 12*b* adhered and fixed to the second surface 15*b*, and a plurality of elastic supporting beams 12*c* extending in a generally U shape between the first and the second ends 12*a* and 12*b* away from the base member 15 in a predetermined direction. The supporting beams 12*c* may collectively be called a supporting portion.

The electrodes 13 extend along outer surfaces of the supporting beams 12*c* between the first and the second ends 12*a* and 12*b* and are fixed to the supporting beams 12*c*, respectively. The electrodes 13 are collectively called a conductive portion. Desirably, the electrodes 13 comprise metal thin films formed by plating, sputtering, or the like and deposited to the thickness on the order of several micrometers.

Next, description will be made of a method of producing the connector 11.

At first, a flat insulating sheet is prepared. On one surface of the insulating sheet, a metal thin film is formed except opposite end portions thereof. In the insulating sheet, a plurality of slots are formed by punching or the like in an area where the metal thin film is formed. The slots extend across the area to intrude into the opposite end portions. As a result, the metal thin film is electrically separated by the slots into a plurality of the electrodes 13. Thus, the electrode sheet 14 with the electrodes 13 formed on the supporting beams 12*c*, respectively, is produced. Desirably, the insulating sheet is made of a material, such as polyimide or aramid, which is excellent in heat resistance, corrosion resistance, and insulation and which is thin and easily deformable.

Punching may be carried out in various manners. Among others, pressing or laser cutting provides the electrodes 3 arranged at a narrow pitch on the order of several hundreds micrometers. The electrodes 13 may be formed by punching the insulating sheet and thereafter forming metal thin films on divided portions obtained by punching.

On the other hand, one end of the base member 15 is provided with a plurality of grooves 15*c* each of which has a size allowing insertion of each electrode 13 of the electrode sheet 14. The grooves 15*c* are arranged at a pitch equal to that of the supporting beam 12*c* or the electrodes 13. Each groove 15*c* has a width substantially equal to or slightly wider than that of each supporting beam 12*c* or each electrode 13. The base member 15 is preferably made of a material, such as polyimide or aramid, which is excellent in heat resistance, corrosion resistance, and insulation and which is thin and easily deformable.

Next, the electrode sheet 14 is coupled to the base member 15 so that the supporting beams 12*c* and the electrodes 13 are inserted into the grooves 15*c*, respectively. Further, opposite end portions of the electrode sheet 14 are adhered and fixed to the first and the second surfaces 15*a* and 15*b* of the base member 15, respectively. With this structure, even if the electrodes 13 are misaligned upon coupling the electrode sheet 14 with the base member 15, the electrodes 13 are automatically corrected in position by the grooves 15*c*. Therefore, it is possible to easily and reliably align the electrodes 13 of the connector 11 with electrodes of both of the connection object boards.

Figure 4B:
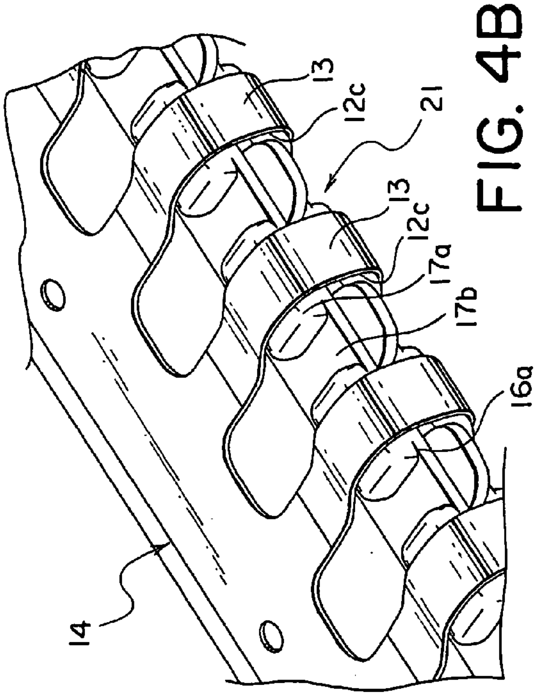
FIG. 4B is an enlarged perspective view of a characteristic part of the connector in FIG. 4A.
Figure 4A:
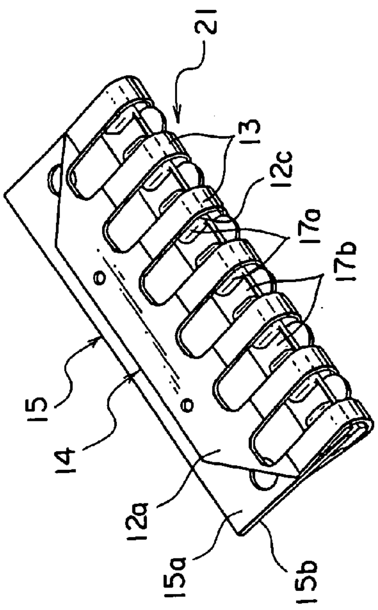
FIG. 4A is a perspective view of a connector according to a third embodiment of this invention.
Figure 4C:
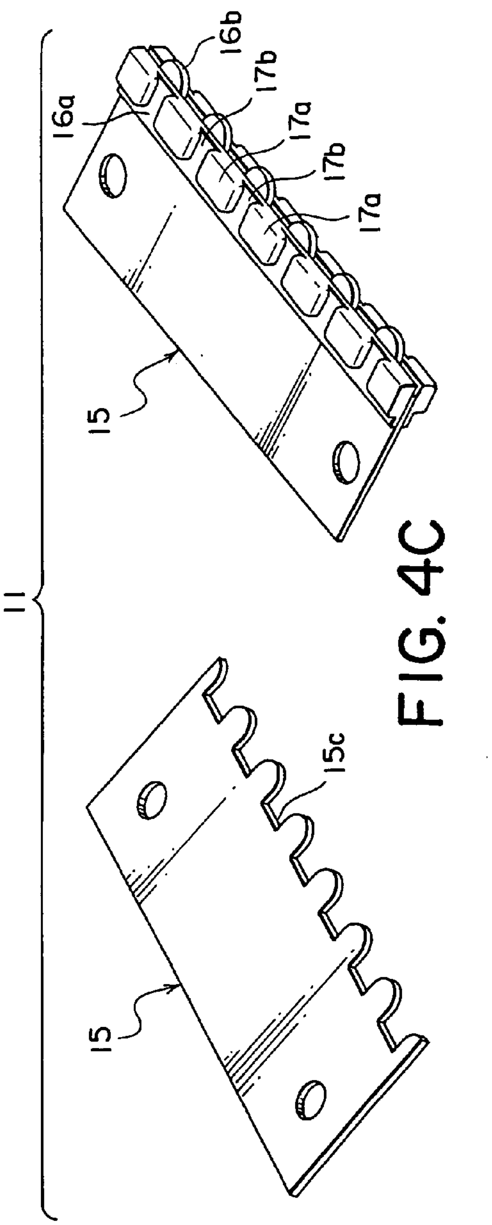
FIG. 4C is an exploded perspective view of the connector in FIG. 4A.

Referring to FIGS. 4A to 4C, description will be made of a structure of a connector according to a third embodiment of this invention. Similar parts are designated by like reference numerals and description will be omitted.

The connector is depicted at 21 in the figures and is adapted to be interposed between two connection object boards to connect the connection object boards to each other. In the connector 21, first and second elastic members 16*a* and 16*b* are fixed to the first and the second surfaces 15*a* and 15*b* of the base member 15, respectively. Each of the first and the second elastic members 16*a* and 16*b* is provided with a plurality of protrusions 17*a* and a plurality of recesses 17*b* alternately formed in a preselected direction. The protrusions 17*a* are formed at positions faced to the supporting beams 12*c*. Thus, a patterned indented structure comprising the protrusions 17*a* and the recesses 17*b* is provided. The presence of the patterned indented structure assures stable connection between the connector 21 and the connection object boards. Specifically, when the connector 21 is applied with compressive force by the connection object boards on upper and lower sides, the protrusions 17*a* are easily elastically deformed to thereby realize stable connection. For example, even if each of the connection object boards is deformed or warped, stable connection is achieved at an electrode level.

Figure 5A:
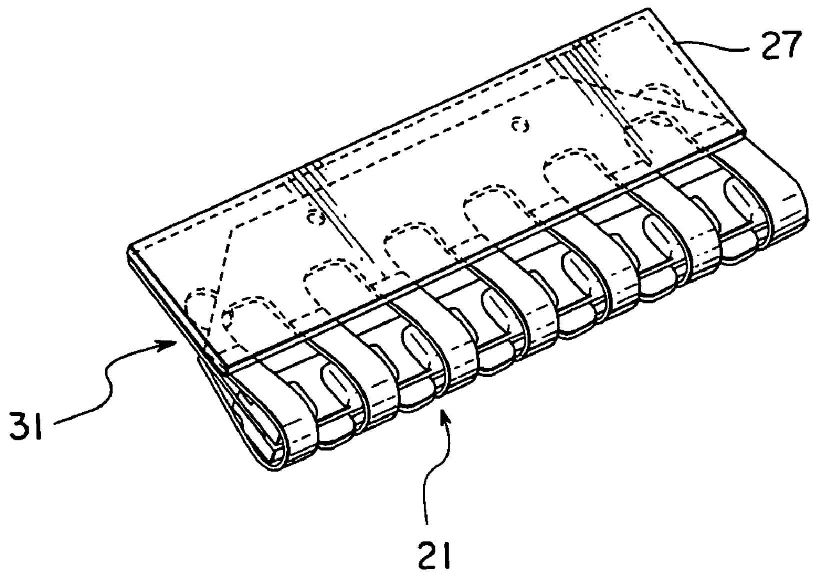
FIG. 5A is a perspective view of a connector according to a fourth embodiment of this invention.
Figure 5B:
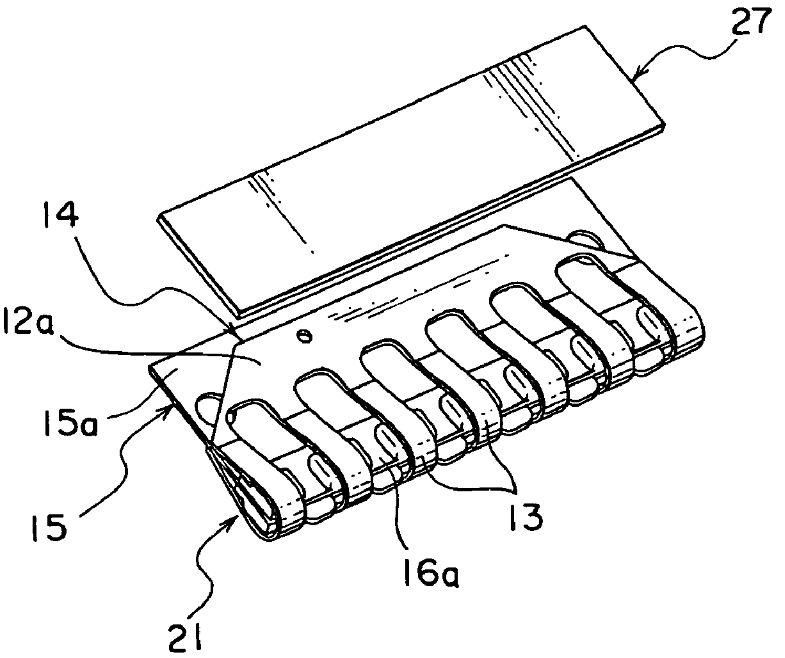
FIG. 5B is a partially-exploded perspective view of the connector in FIG. 5A.

Referring to FIGS. 5A and 5B, description will be made of a structure of a connector according to a fourth embodiment of this invention. Similar parts are designated by like reference numerals and description thereof will be omitted.

The connector is depicted at 31 in the figures and is adapted to be interposed between two connection object boards to connect these boards to each other. The connector 31 comprises the connector 21 in FIG. 4A and two double-sided adhesive sheets (only one of which is depicted at 27) added to the connector 21. One of the double-sided adhesive sheets 27 has one adhesive surface fixedly attached onto the first end 12*a* of the insulating sheet 12 and the first surface 15*a* of the base member 15 with the former stacked or put on the latter. Similarly, another of the double-sided adhesive sheets 27 has one adhesive surface fixedly attached onto the second end 12*b* of the insulating sheet 12 and the second surface 15*b* of the base member 15 with the former stacked or put on the latter. Each of the double-sided adhesive sheets 27 has the other adhesive surface used to fixedly attach each of the connection object boards.

Connection between the connector 31 and the connection object board is autonomously held by the double-sided adhesive sheet 27 so that fixing means such as solder is unnecessary. Therefore, upon occurrence of improper connection between the connector 31 and the connection object board, the double-sided adhesive sheet 27 is separated and adhered again so as to cancel the improper connection. Thus, disposal of products can be minimized.

Figure 6:
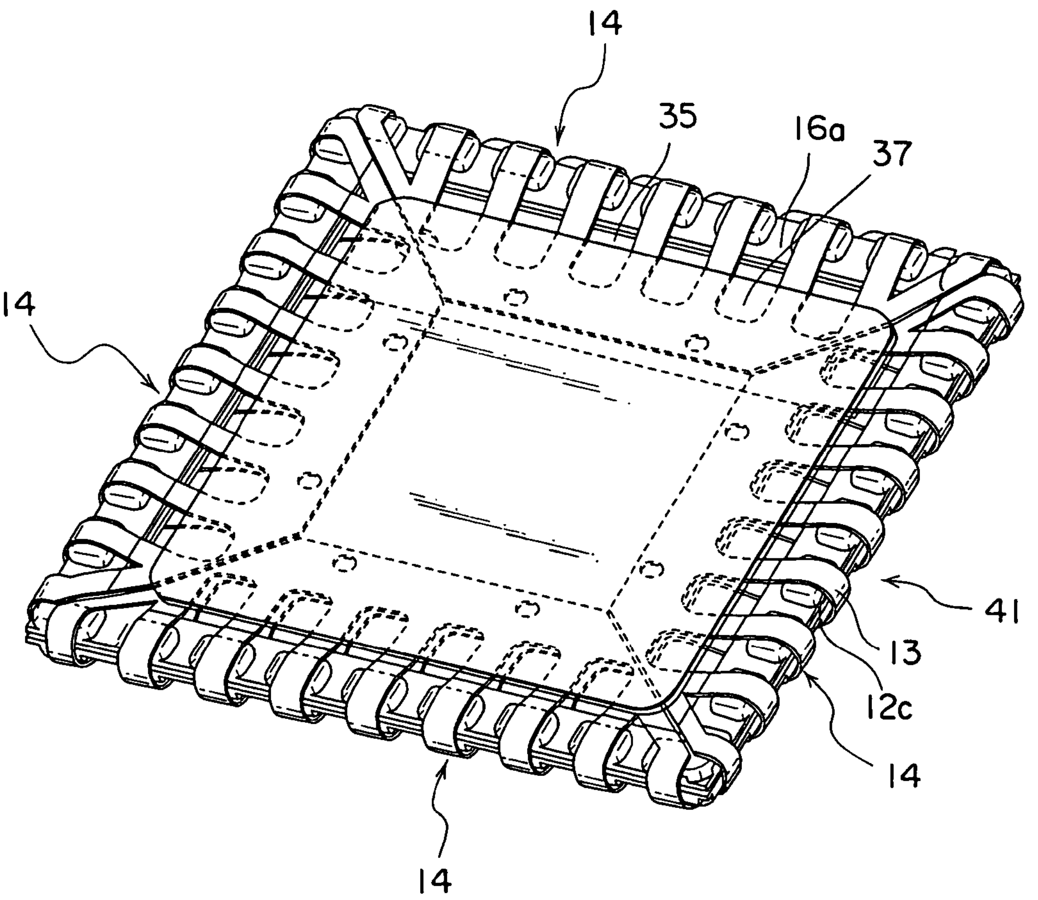
FIG. 6 is a perspective view of a connector according to a fifth embodiment of this invention.
Figure 7A:
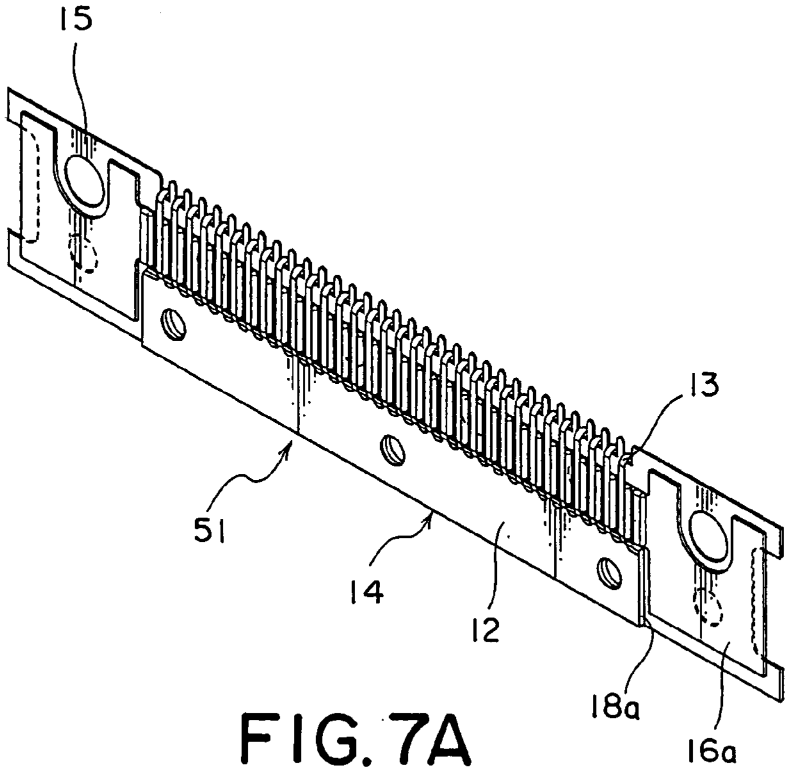
FIG. 7A is a perspective view of a connector according to a sixth embodiment of this invention.
Figure 7B:
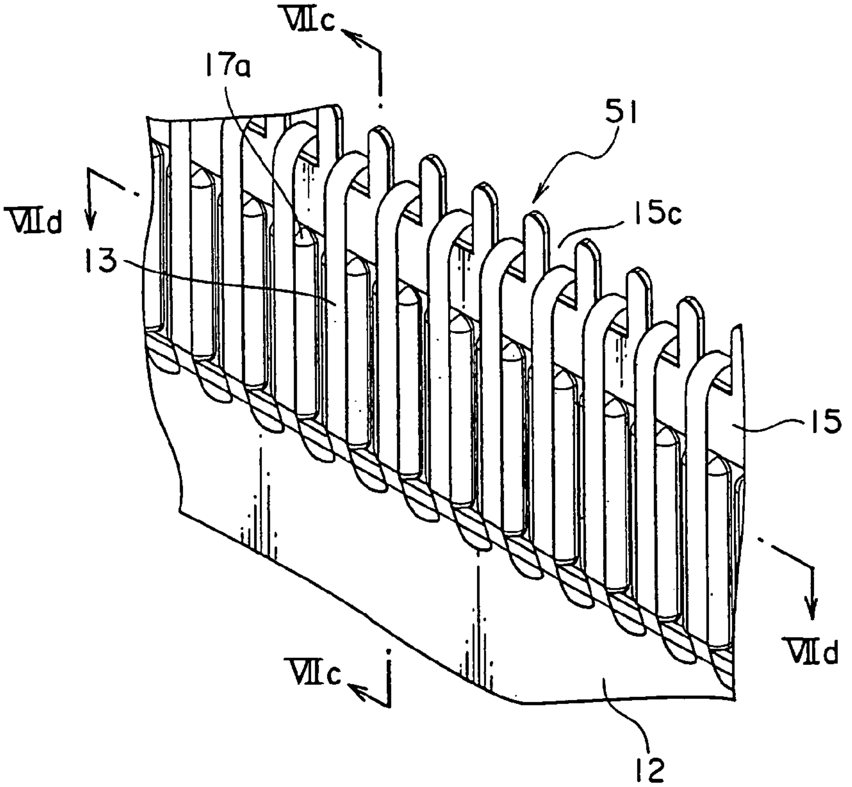
FIG. 7B is an enlarged perspective view of a characteristic part of the connector in FIG. 7A.
Figure 7C:
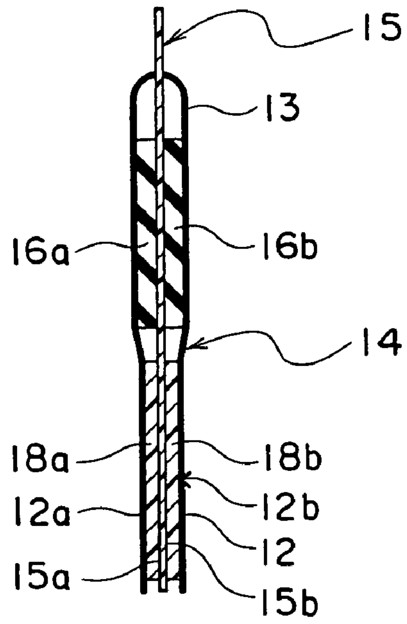
FIG. 7C is a sectional view taken along a line VIIc—VIIc in FIG. 7B.
Figure 7D:
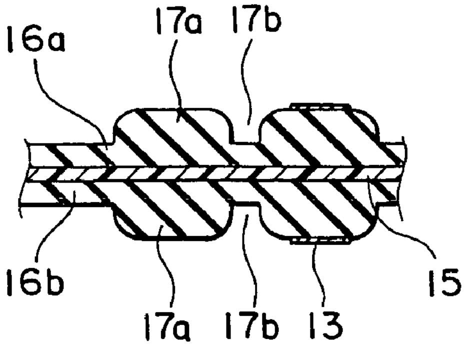
FIG. 7D is a sectional view showing only a part of the connector and taken along a line VIId—VIId in FIG. 7B.

Referring to FIG. 6, description will be made of a structure of a connector according to a fifth embodiment of this invention. Similar parts are designated by like reference numerals and description thereof will be omitted.

The connector is depicted at 41 in the figure and comprises four electrode sheets each of which is similar to the electrode sheet 14 in FIG. 3B and each of which is also depicted by a reference numeral 14. The electrode sheets 14 are attached to four edges of a rectangular base member 35 corresponding to the base member 15 in the connector 11 in FIG. 3A, respectively. Therefore, a number of supporting beams 12*c* are arranged along the four edges of the base member 35.

Further, a double-sided adhesive sheet 37 is fixedly attached to at least one of upper and lower surfaces of the base member 35. The double-sided adhesive sheet 37 extends outward to positions corresponding to the supporting beams 12*c* of the electrode sheet 14. With this structure, the double-sided adhesive sheet 37 adheres the connector 41 and the connection object board so that connection between the electrodes 13 of the connector 41 and the electrodes of the connection object board is reliably achieved.

Since the electrode sheets 14 are arranged on all of four sides of the rectangular base member 35, the connector 41 is applicable to a connecting portion of a known CCD module or the like. In this case, since each electrode 13 can be realized with the thickness of 0.4 mm or less, a space occupied by a connector mounting portion can be saved. The electrode sheets 14 may be provided only on two or three sides of the base member 35.

Referring to FIGS. 7A to 7D, description will be made of a structure of a connector according to a sixth embodiment of this invention. Similar parts are designated by like reference numerals and description thereof will be omitted.

In the connector depicted at 51 in the figures, the base member 15 is provided with a number of grooves 15*c* formed at a predetermined pitch. A number of electrodes 13 of the electrode sheet 14 are inserted into the grooves 15*c*, respectively. Between each electrode 13 and the base member 15, the protrusions 17*a* of the elastic members 16*a* and 16*b* are interposed. The first and the second ends 12*a* and 12*b* of the insulating sheet 12 of the electrode sheet 14 are fixedly attached to the first and the second surfaces 15*a* and 15*b* of the base member 15 via double-sided adhesive sheets 18*a* and 18*b*, respectively.

The material and the thickness of the connector 51 will be described. The base member 15 has a thickness of 0.05 mm. The insulating sheet 12 has a thickness of 4 μm if the material is polyamide and has a thickness of 12.5 μm if the material is polyimide. Each of the elastic members 16*a* and 16*b* is made of silicone gel and has a thickness of 0.2 mm at the protrusion 17*a*. Each of the double-sided adhesive sheets 18*a* and 18*a* has a thickness of 145 μm.

Figure 8:
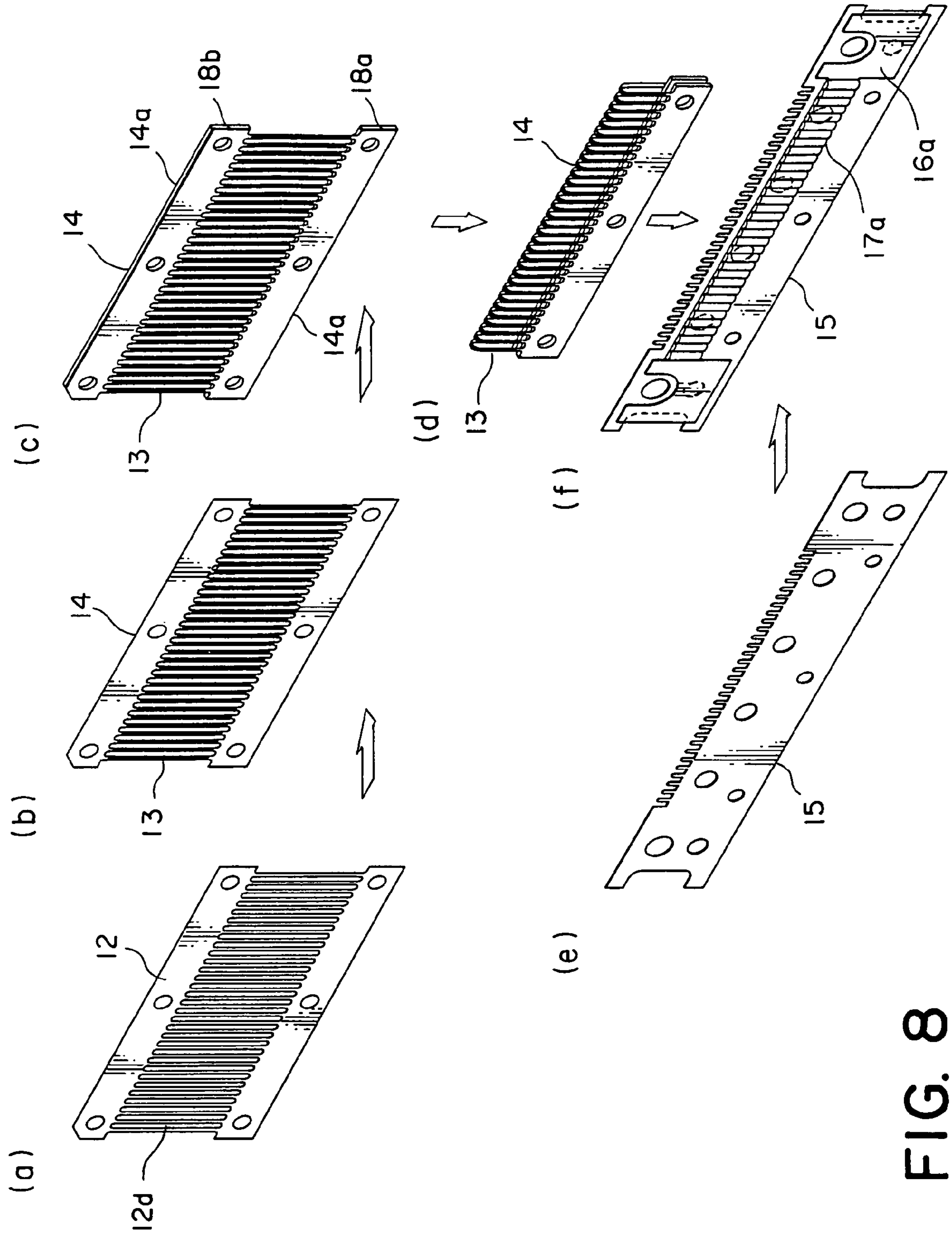
FIG. 8 is a perspective view for describing a method of producing the connector in FIG. 7A.

Referring to FIG. 8, description will be made of a method of producing the connector 51.

In a step (a) at first, the insulating sheet 12 having a number of slits 12*d* formed at a center portion and extending in parallel to one another is formed by laser machining, press working, or the like. Next, in a step (b), a metal thin film is attached to the center portion of the insulating sheet 12 by sputtering or the like to produce the electrode sheet 14 having a number of electrodes 13. Then, in a step (c), one surfaces of the double-sided adhesive sheets 18*a* and 18*b* are adhered to fixing portions 14*a* on opposite sides of the electrode sheet 14, respectively. Further, in a step (d), the electrode sheet 14 is folded in two at the center of each electrode 13.

On the other hand, in a step (e), the base member 15 of a plate-like shape is formed by laser machining, press working, or the like. Next, in a step (f), the elastic members (only one being depicted at 16*a* in the figure) are adhered to the opposite surfaces of the base member 15, respectively. The elastic members 16*a* may be formed integral with the base member 15.

Next, the electrode sheet 14 folded in two is attached to the base member 15 in a direction depicted by an arrow. The other surfaces of the double-sided adhesive sheets 18*a* and 18*b* are attached to the opposite surfaces of the base member 15, respectively.

Figure 9A:
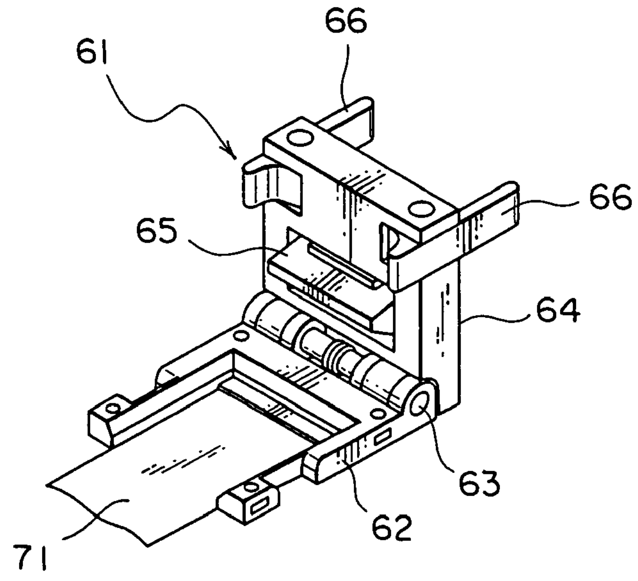
FIG. 9A is a perspective view showing a connecting tool for connecting a FPC to the connector in FIG. 7A before it is operated.
Figure 9B:
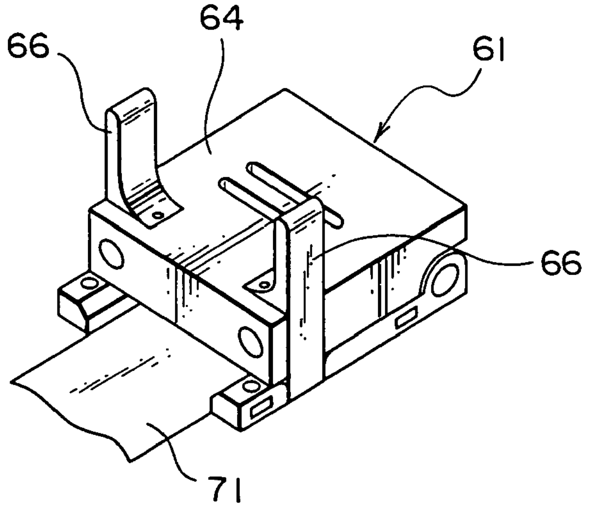
FIG. 9B is a perspective view of the connecting tool after it is operated.

Referring to FIGS. 9A and 9B, description will be made of a connecting tool 61 for connecting the connector 51 to the two connection object boards. One of the connection object boards is a FPC (flexible printed circuit) 71.

The connecting tool 61 comprises a support plate 62, a rotary plate 64 attached to the support plate 62 by a hinge 63 to be rotatable by 90°, a pusher 65 fixed to the rotary plate 64, and a pair of tabs 66 fixed to the rotary plate 64. The FPC 71 is set on the support plate 62.

Figure 10A:
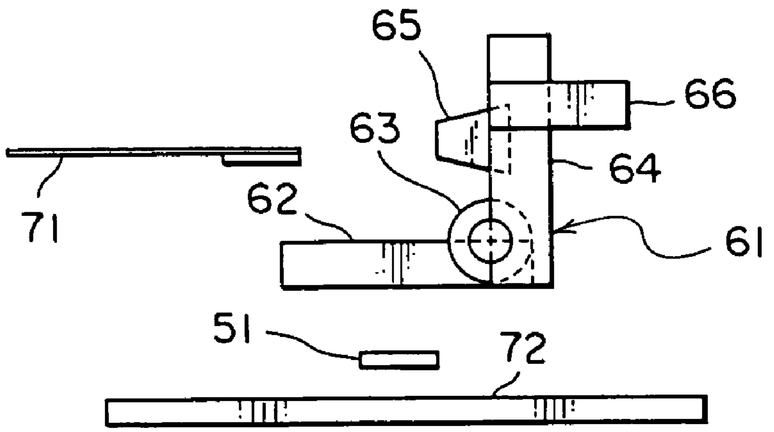
FIG. 10A is a schematic sectional view of the connecting tool in an unassembled state for describing a method of using the connecting tool.
Figure 10B:
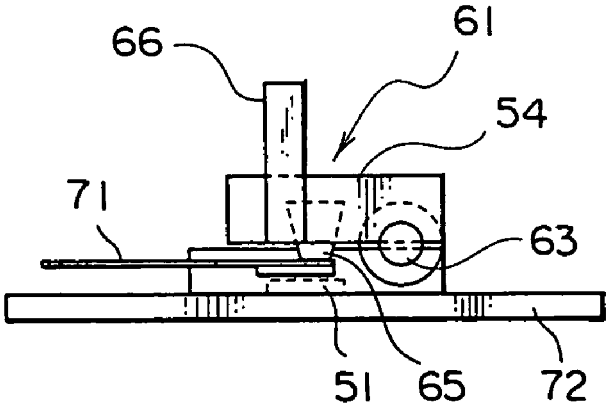
FIG. 10B is a schematic sectional view of the connecting tool in an assembled state.
Figure 11A:
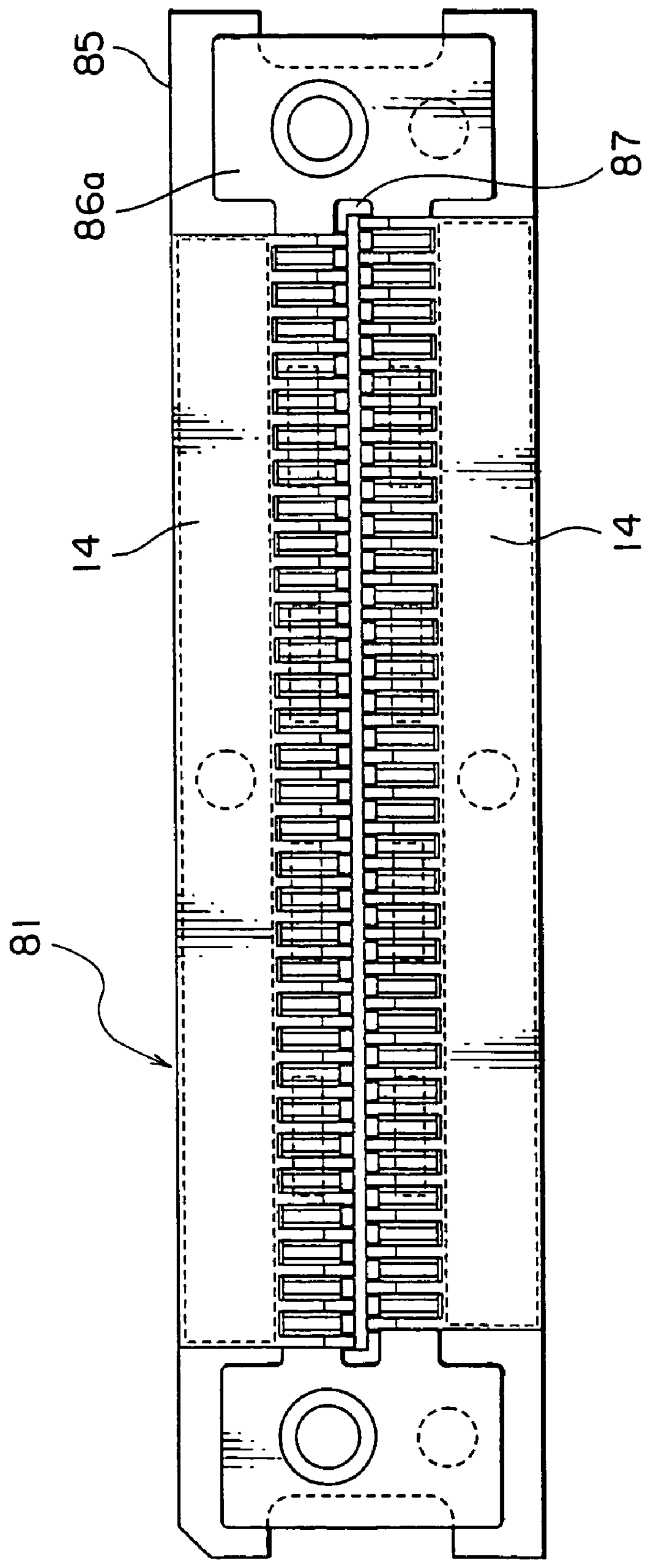
FIG. 11A is a front view of a connector according to a seventh embodiment of this invention.
Figure 11B:
FIG. 11B is a side view of the connector illustrated in FIG. 11A.
Figure 11C:
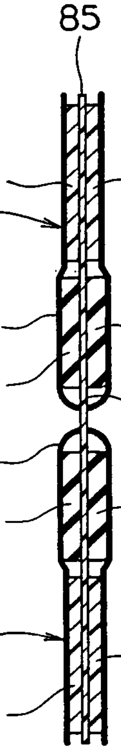
FIG. 11C is a sectional view of the connector illustrated in FIG. 11A as a view similar to FIG. 7C.
Figure 11D:
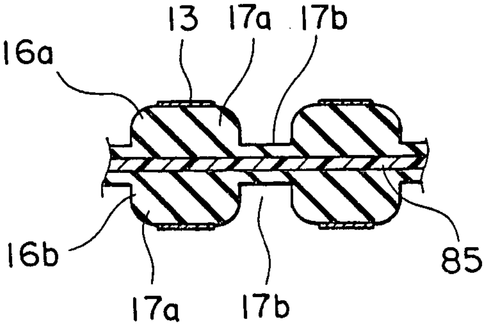
FIG. 11D is a sectional view of the connector illustrated in FIG. 11A as a view similar to FIG. 7D.

Referring to FIGS. 10A and 10B, description will be made of a method of connecting the FPC 71 to the connector 51 by the use of the connecting tool 61.

At first referring to FIG. 10A, the connector 51 is placed on a circuit board 72 as the other connection object board. Thereafter, the connecting tool 61 is fixed to the board 72 by screws or the like. Then, the connector 51 is held on the board 72 by the connecting tool 61.

Next, contacting portions at an end of the FPC 71 are put on contact portions of the connector 51, respectively. Subsequently, as shown in FIG. 10B, the tabs 66 are held by fingers and the rotary plate 64 is rotated counterclockwise by 90° around the hinge 63. Then, the pusher 65 brings the contacting portions of the FPC 71 into press contact with the contact portions of the connector 51, respectively.

Referring to FIGS. 11A to 11D, description will be made of a structure of a connector according to a seventh embodiment of this invention. Similar parts are designated by like reference numerals and description thereof will be omitted.

In the connector depicted at 81 in the figures, a base member 85 corresponds to the base member 15 of the connector 51 illustrated in FIGS. 7A to 7D while elastic members 86*a* and 86*b* correspond to the elastic members 16*a* and 16*b* of the connector 51. The elastic members 86*a* and 86*b* are fixed to opposite surfaces of the base member 85, respectively. At the center of the base member 85 and the elastic members 86*a* and 86*b*, a slit 87 is formed. Two electrode sheets 14 are provided so as to pass through the slit 87.

Each electrode sheet 14 is folded back and, in the manner similar to the connector 51 illustrated in FIGS. 7A to 7D, are fixedly adhered to the opposite surfaces of the base member 85 via the double-sided adhesive sheets 18*a* and 18*b*. Between the electrodes 13 of the electrode sheet 14 and the base member 85, the elastic members 16*a* and 16*b* are interposed. The protrusions 17*a* of the elastic members 16*a* and 16*b* are faced to the electrodes 13. A number of electrodes 13 of the electrode sheet 14 are inserted into grooves of the base member 85 to thereby position the electrodes 13. Thus, the connector 81 is substantially equivalent to a structure in which two connectors 51 shown in FIGS. 7A to 7D are faced to each other.

The electrodes 13 of the two electrode sheets 14 are arranged in a staggered fashion along the slit 87. This structure is easily realized by coupling the two electrode sheets 14 with the base member 85 in a state where the electrode sheets 14 are shifted from each other by a half of the pitch of the electrodes 13.

While the present invention has thus far been described in connection with several preferred embodiments thereof, it will readily be possible for those skilled in the art to put this invention into practice in various other manners. Although the term "sheet" is used in the foregoing description, this term may be replaced by a tape or a film.

What is claimed is:

1. A connector adapted to be interposed between two connection objects to connect the connection objects to each other, the connector comprising:

a base member of a plate-like shape having first and second surfaces opposite to each other;

an insulating sheet including a first end fixed in position to the first surface, a second end fixed in position to the second surface, and a supporting portion having elasticity and extending between the first and the second ends with a space left between the supporting portion and the base member; and a conductive portion supported by the supporting portion and adapted to be contacted with the connection objects, the conductive portion having a plurality of electrodes extending between the first and the second ends with a space left between one another, and the supporting portion having a plurality of supporting beams corresponding to the electrodes, the base member receiving the supporting beams to position the electrodes.

2. The connector according to claim 1, wherein the base member has a rectangular shape with four edges, the supporting portion being arranged along the edges in a circumferential direction and having a number of supporting beams connected between the first and the second ends, the conductive portion having a number of electrodes supported by the supporting beams, respectively.

3. The connector according to claim 1, wherein the base member has a pair of edges spaced from each other, the supporting portion having a number of supporting beams arranged along the edges in a staggered fashion and connected between the first and the second ends, the conductive portion having a number of electrodes supported by the supporting beams, respectively.

4. A connector adapted to be interposed between two connection objects to connect the connection objects to each other, the connector comprising:

a base member of a plate-like shape having first and second surfaces opposite to each other;

an insulating sheet including a first end fixed in position to the first surface, a second end fixed in position to the second surface, and a supporting portion having elasticity and extending between the first and the second ends with a space left between the supporting portion and the base member;

a conductive portion supported by the supporting portion and adapted to be contacted with the connection objects; and an elastic member interposed between the supporting portion and each of the first and the second surfaces.

5. The connector according to claim 4, wherein the supporting portion has a plurality of supporting beams extending between the first and the second ends with a space left from one another, the elastic member having a plurality of protrusions corresponding to the supporting beams, respectively.

6. The connector according to claim 5, wherein the supporting beams are brought into contact with the protrusions, respectively.

7. The connector according to claim 4, wherein the conductive portion has a plurality of electrodes extending between the first and second ends with a space left between one another, and the supporting portion has a plurality of supporting beams corresponding to the electrodes, the base member receiving the supporting beams to position the electrodes.

8. A connector adapted to be interposed between two connection objects to connect the connection objects to each other, the connector comprising:

a base member of a plate-like shape having first and second surfaces opposite to each other;

an insulating sheet including a first end fixed in position to the first surface, a second end fixed in position to the second surface, and a supporting portion having elasticity and extending between the first and the second ends with a space left between the supporting portion and the base member;

a conductive portion supported by the supporting portion and adapted to be contacted with the connection objects; and an adhesive member fixing the insulating sheet to the base member.

9. The connector according to claim 8, wherein the adhesive member includes a first double-sided adhesive sheet interposed between the first surface and the first end to fixedly attach the first surface and the first end to each other and a second double-sided adhesive sheet interposed between the second surface and the second end to fixedly attach the second surface and the second end to each other.

10. The connector according to claim 8, wherein the first end is put on the first surface, the adhesive member including an adhesive sheet fixedly attached to the first end and the first surface.

11. The connector according to claim 10, wherein the adhesive sheet is a double-sided adhesive sheet and adapted to fixedly attach one of the connection objects.

12. The connector according to claim 8, wherein the conductive portion has a plurality of electrodes extending between the first and second ends with a space left between one another, and the supporting portion has a plurality of supporting beams corresponding to the electrodes, the base member receiving the supporting beams to position the electrodes.

* * * * *